(12) United States Patent
Mozak

(10) Patent No.: US 9,658,642 B2
(45) Date of Patent: May 23, 2017

(54) TIMING CONTROL FOR UNMATCHED SIGNAL RECEIVER

(71) Applicant: Intel Corporation, Santa Clara, CA (US)

(72) Inventor: Christopher P. Mozak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 579 days.

(21) Appl. No.: 14/038,537

(22) Filed: Sep. 26, 2013

(65) Prior Publication Data

US 2015/0003574 A1    Jan. 1, 2015

Related U.S. Application Data

(60) Provisional application No. 61/841,857, filed on Jul. 1, 2013.

(51) Int. Cl.
*G06F 1/00* (2006.01)
*H04L 7/00* (2006.01)
*G06F 1/04* (2006.01)
*G11C 7/22* (2006.01)
*H03L 7/00* (2006.01)
*G11C 27/02* (2006.01)

(52) U.S. Cl.
CPC ............. *G06F 1/04* (2013.01); *G11C 7/222* (2013.01); *G11C 27/02* (2013.01); *H03L 7/00* (2013.01); *H04L 7/0008* (2013.01)

(58) Field of Classification Search
CPC .................................................... H04L 7/0012
USPC ........................................................ 375/355
See application file for complete search history.

(56) References Cited

U.S. PATENT DOCUMENTS 4,519,086 A * 5/1985 Hull ..................... H03L 7/0891
327/141
6,509,771 B1 * 1/2003 Atallah ................ H03K 5/1565
327/175

(Continued)

FOREIGN PATENT DOCUMENTS

WO    WO-2008/061064    5/2008

OTHER PUBLICATIONS

PCT/US2014/045091 Notification of Transmittal of the International Search Report and the Written Opinion of the International Searching Authority, mailed Oct. 15, 2014, 13 pages.

*Primary Examiner* — Thomas Lee
*Assistant Examiner* — Aaron J Browne
(74) *Attorney, Agent, or Firm* — Blakely, Sokoloff, Taylor & Zafman LLP

(57) ABSTRACT

A device with an I/O interface includes a replica clock distribution path matched to a clock distribution path of an unmatched receiver circuit. The device can monitor changes in delay in the replica path, and adjust delay in the real clock distribution path in response to the delay changes detected in the replica path. The receiver circuit includes a data path and a clock distribution network in an unmatched configuration. A ring oscillator circuit includes a replica clock distribution network matched to the real clock distribution network. Thus, delay changes detected for the replica clock distribution network indicates a change in delay in the real clock distribution network, which can be compensated accordingly.

20 Claims, 8 Drawing Sheets

(56) References Cited

U.S. PATENT DOCUMENTS

| | | |
|---|---|---|
| 7,602,056 B2 | 10/2009 | Zhao et al. |
| 7,647,476 B2 | 1/2010 | Mozak et al. |
| 7,886,174 B2 | 2/2011 | Spry et al. |
| 8,331,176 B2 | 12/2012 | Mozak et al. |
| 8,582,374 B2 | 11/2013 | Mozak et al. |
| 8,819,474 B2 | 8/2014 | Schoenborn et al. |
| 8,868,992 B2 | 10/2014 | Spry et al. |
| 8,929,157 B2 | 1/2015 | Mozak et al. |
| 2007/0200635 A1 | 8/2007 | Meltzer |
| 2007/0217559 A1 | 9/2007 | Stott et al. |
| 2009/0015342 A1* | 1/2009 | Kleveland ................ H03B 5/36 331/116 R |
| 2011/0169527 A1* | 7/2011 | Kitagawa ......... H03K 19/01858 326/82 |
| 2011/0235459 A1 | 9/2011 | Ware et al. |
| 2013/0044845 A1 | 2/2013 | Zerbe |
| 2013/0301336 A1* | 11/2013 | Sills ....................... G11C 11/00 365/148 |
| 2014/0089705 A1 | 3/2014 | Man et al. |
| 2014/0176215 A1* | 6/2014 | Ahmed .................... G06F 1/10 327/269 |
| 2014/0189224 A1 | 7/2014 | Kostinsky et al. |
| 2014/0189433 A1 | 7/2014 | Schoenborn et al. |
| 2015/0131398 A1* | 5/2015 | Frans ...................... G11C 8/18 365/233.1 |

\* cited by examiner

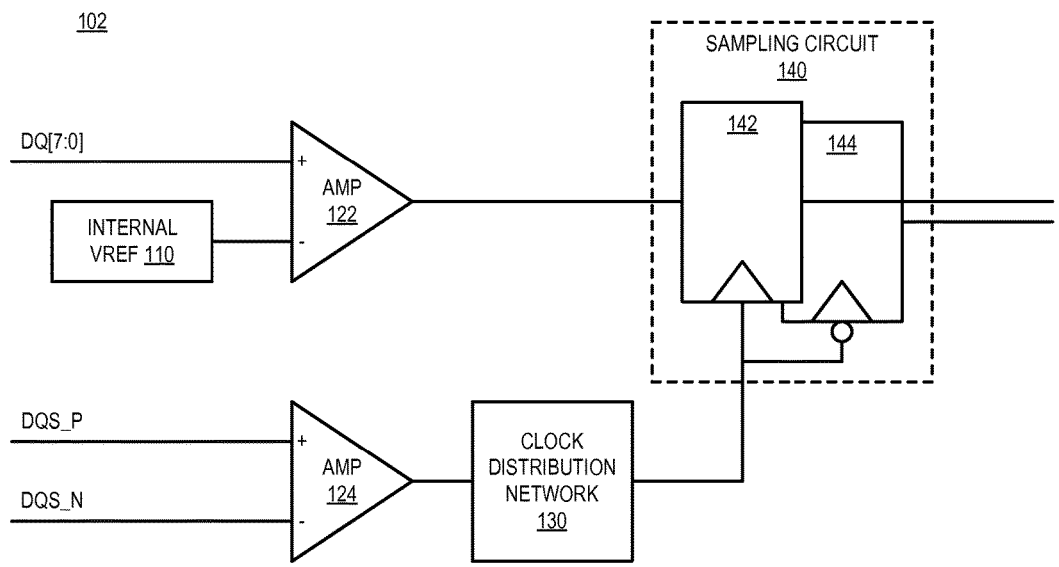
FIG. 1A – Prior Art
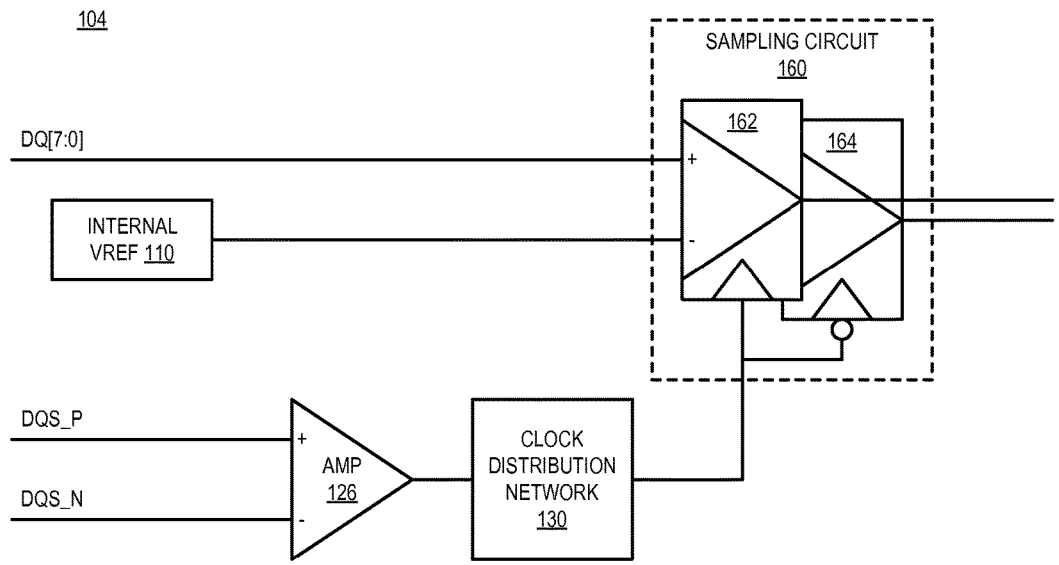
FIG. 1B – Prior Art

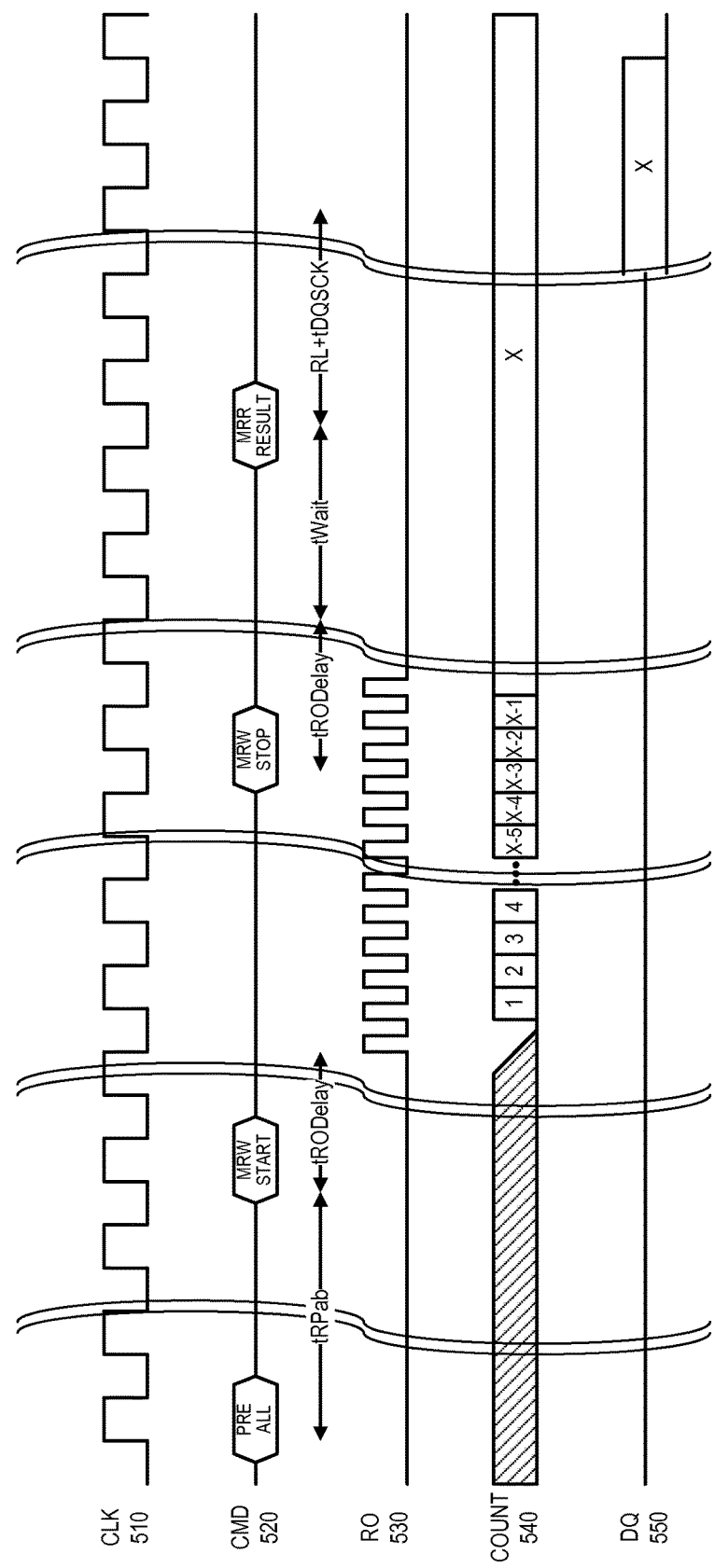

TIMING CONTROL FOR UNMATCHED SIGNAL RECEIVER

RELATED APPLICATIONS

This application is a nonprovisional application based on U.S. Provisional Patent Application No. 61/841,857, filed Jul. 1, 2013, and claims the benefit of priority of that provisional application. Provisional Application No. 61/841,857 is hereby incorporated by reference.

FIELD

Embodiments of the invention are generally related to memory device writes, and more particularly to timing control for memory device writes in an unmatched architecture.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2013, Intel Corporation, All Rights Reserved.

BACKGROUND

Communication between components on a host platform is necessary for operation of an electronic device. However, various conditions affect the timing of high-speed communication between components, such as temperature change and voltage variation. In general, the communication among different components can be referred to as I/O (input/output), and is frequently governed by standards (e.g., between components of a memory subsystem). The I/O standards can relate to performance characteristics for I/O power, I/O latency, and I/O frequency. The standards or nominal values of I/O performance settings are set to values that can be achieved across different systems for compatibility and interoperability. Typically, there are tradeoffs between power and latency. Thus, using tight timing parameters can reduce power, but causes the I/O latency to be more negatively affected by temperature, voltage, and process variation.

In memory subsystems, it is common to use a matched architecture, where both a data path (DQ) and a data strobe path (DQS) are amplified by matched continuous time amplifiers. FIG. 1A is a block diagram of a known matched receiver circuit. In matched architecture 102, amplifier 124 of the strobe path is matched to amplifier 122 of the data path. The data path includes data input DQ[7:0] input into amplifier 122 with internal Vref signal 110. The data strobe path includes inputs for a differential receiver, where DQS_P represents the positive differential signal, and DQS_N represents the negative differential signal. Amplifier 124 feeds into clock distribution network 130, which provides a network to distribute the clock signal to multiple recipient devices at the same time. Specifically shown is a signal going to elements 142 and 144 of sampling circuit 140.

Using an unmatched architecture can improve the receiver's power and performance as compared to using a matched architecture. FIG. 1B is a block diagram of a known unmatched receiver circuit. In unmatched architecture 104, the data (DQ) voltage is sampled directly at the pad. After being sampled, the system can amplify the signal without the tight timing constraints needed for matched architecture 102. Namely, amplification can occur over an entire UI (unit interval) or possibly more. Thus, the gain/bandwidth requirements of the unmatched receiver are lower than that of the matched receiver. As illustrated, DQ[7:0] and internal Vref 110 are fed directly to elements 162 and 164 of sampling circuit 160. The DQS path still requires a continuous time amplifier, amplifier 126, but the swing on DQS is typically larger than the swing on DQ, which means a lower gain amplifier 126 can be used, as it does not have to be matched to a high gain amplifier in the data path.

Unmatched architecture 104 improves certain receiver bandwidth and voltage sensitivities with respect to matched architecture 102, but degrades the timing control. The delay on the DQS and DQ paths are not self-compensating in unmatched architecture 104. Thus, any change in $T_{DQS}$, or the time to propagate a strobe signal through amplifier 124 or clock distribution network 130, will directly degrade the receiver timing budget. Existing training can correct the timing once, but any drift from the trained position will directly affect timing margin. Drift can occur across voltage, temperature, and/or aging, which will degrade timing margins and possibly create link failures.

Periodic training is known in which training data is written across the link (e.g., from a memory controller to a DRAM (dynamic random access memory)) and checked for errors. However, periodic training suffers from complexity and load on the bus bandwidth. Additionally, the training would be most effective if a large number of samples were averaged, but averaging more samples directly conflicts with the desire for a high bandwidth data link that is used for real data operations. Furthermore, such periodic training is inherently slow because of the iterative nature of the feedback loop, which search multiple settings to find an optimal value.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 1A is a block diagram of a known matched receiver circuit.

FIG. 1B is a block diagram of a known unmatched receiver circuit.

FIG. 5 is a timing diagram of an embodiment of operation timing for an oscillator circuit with a replica clock distribution path.

Figure 2:
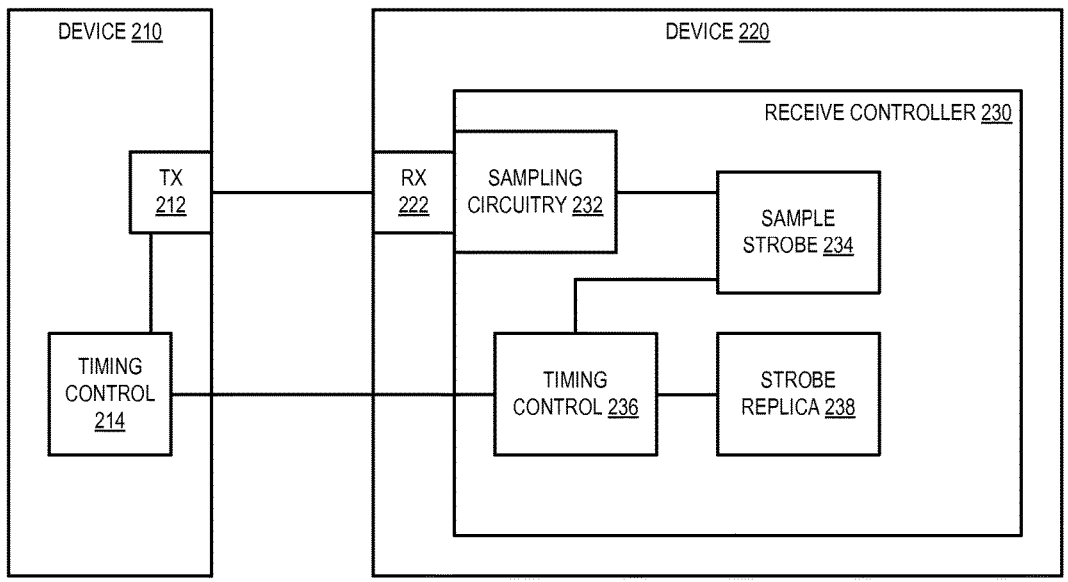
FIG. 2 is a block diagram of an embodiment of a system having an unmatched receiver circuit and a replica clock distribution path.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a component to component I/O interface uses an unmatched receiver circuit. The unmatched receiver includes a replica clock distribution path matched to a clock distribution path that controls sampling circuitry. In the description, "clock distribution path" refers to any or all parts of the path, including the clock distribution path itself, the amplifier, or other parts of the path. The device can monitor changes in delay in the replica path, and adjust delay in the real clock distribution path in response to the delay changes detected in the replica path. The receiver circuit includes a data path and a clock distribution network in an unmatched configuration. A ring oscillator circuit includes a replica clock distribution network matched to the real clock distribution network. Thus, delay changes detected for the replica clock distribution network indicates a change in delay in the real clock distribution network, which can be compensated accordingly.

In one embodiment, a test system or test engine described can be used to test memory subsystems, and more specifically, the I/O (input/output) or communication between a platform component (e.g., a processor, a memory controller) and a memory device. Any memory subsystem that uses a memory controller with a scheduler or equivalent logic can implement at least one embodiment of a test engine. Reference made herein to memory devices can include different memory types. For example, memory subsystems commonly use DRAM, which is one example of a memory device as described herein. Thus, the test engine described herein is compatible with any of a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR4 (low power dual data rate version 4, specification in development by JEDEC as of the filing of this application), WIDEIO (specification in development by JEDEC as of the filing of this application), and/or others, and technologies based on derivatives or extensions of such specifications.

In one embodiment, operation of an I/O interface circuit can be further controlled via the use of empirical testing. Based on changes in delay detected by a replica clock distribution path, a system can empirically test performance parameters of device I/O (input/output) to determine what parameter(s) to modify to adjust for the detected delay. Based on the empirical testing via a test system, the system can set the performance parameters specific to the system or device in which the inter-device communication takes place. For each of multiple different settings for multiple different I/O circuit parameters, the test system can set a value for each I/O circuit parameter, generate test traffic to stress test the communication with the parameter value(s), and measure an operating margin for the I/O performance characteristic. The test system can further execute a search function to determine values for each I/O circuit parameter at which the delay is compensated. In one embodiment, the system sets runtime values for the I/O circuit parameters based on the search function. The settings can be dynamically changed for specific components of specific systems based on testing.

As stated above, unmatched architectures can provide significant improvements in bandwidth and frequency with respect to a matched architecture. However, traditional unmatched architectures suffer from degraded timing control. As described in more detail below, an unmatched receiver architecture can have improved timing control through the use of a matched replica clock distribution path used to predict changes in timing for the real clock distribution path. In one embodiment, the system can adjust timing behavior of the real clock distribution path based on timing changes detected in the replica path. More specifically, the changes in timing detected for the replica path can be assumed to have an equal effect on the edge(s) of the data eye for the real data path. Thus, by tracking changes to the timing in the replica path, changes in the edge(s) of the data eye can be compensated.

In one embodiment, the receiver circuit provides information back to a transmitter to cause the transmitter to adjust its operation based on the detected delay changes. Thus, delay changes can be compensated by changing the transmit behavior of the transmitter device. In one embodiment, the receiver device can compute the delay adjustment needed and/or adjust the receiver delay to compensate for the delay change. In one embodiment, the receiver device simply sends raw data in the form of an oscillator count to the transmitter, which can then compute a timing adjustment based on the detected changes.

FIG. 2 is a block diagram of an embodiment of a system having an unmatched receiver circuit and a replica clock distribution path. System 200 includes device 210, which is shown with transmitting hardware TX 212, and device 220, which is shown with receiving hardware 222. It will be understood that in one embodiment device 220 could also send a transmission to device 210; thus device 220 can include transmitting hardware that is not explicitly shown, and device 210 can include receiving hardware that is not explicitly shown. In one embodiment, the transmitting and receiving hardware is transceiver hardware, which allows interfacing by both transmitting and receiving. The devices are connected via one or more transmission lines, which are driven by a transmit driver. The transmission line can be any type of signal line (e.g., trace, wire) connecting I/O pins of device 210 with device 220.

Device 220 includes receive controller 230, which represents hardware and other logic that performs the receiving operations for device 220. Receive controller 230 can include sampling circuitry 232 to sample the voltage levels of the received signal. Sampling circuitry 232 is controlled by sample strobe 234 or other control signal, which indicates when to sample the incoming or received signal. Sample strobe 234 is generated as a separate signal by receive controller 230. Receive controller 230 includes timing control 236 to control the generation of sample strobe 234.

In one embodiment, receive controller 230 includes strobe replica 238, which is a replica path of sample strobe 234. Drift (either positive or negative) in the timing of sample strobe 234 can negatively affect the ability of device 230 to successful receive the incoming signal. Strobe replica 238 is a path that is matched to the path of strobe sample 234. Thus, the same drift that occurs in strobe sample 234 should occur equivalently in strobe replica 238. Based on the drift, or the change in delay of the strobe signal or control signal, timing control 236 can adjust for the change. In one embodiment, timing control 236 adjusts for delay by signaling device 210 to change its transmit parameters to better match the sampling timing of sampling circuitry 232. Thus, timing control 214 of device 210 can adjust operation of TX 212. In one embodiment, timing control 236 adjusts the timing of strobe sample 234 to adjust the timing of sampling circuitry 232. Thus, system 200 controls the timing of the receive circuitry of device 220 with respect to the transmit circuitry of device 210.

Assuming as one example that device 210 is a memory controller or processor and that device 220 is a memory device, it could be said that system 200 relates to how to measure tDQS delay (the propagation delay of the data strobe signal), and adjust the controller/processor transmitter timing to compensate for changes in the delay. By using strobe replica 238 as a separate circuit, system 200 can measure drift in the strobe signal without impacting normal operation. Thus, the measurement system can provide feedback on precisely how much the strobe delay moved, providing both magnitude and sign of the drift. Also, because strobe replica 238 is a separate circuit that does not affect the performance of the actual data path, system 200 is able to generate many samples of delay measurements to average together, which can significantly improve resolution and accuracy over a system that uses the data path itself for measurement.

It will be understood that the circuit path of sample strobe 234 is not matched to sampling circuitry 232. Thus, receive controller 230 employs an unmatched receiver circuit architecture. Unmatched architectures are typically sensitive to voltage and temperature changes, so the behavior of the circuit (and specifically the delay) changes over time. However, monitoring the change in delay with strobe replica 238 allows system 200 to adjust the strobe signal delay, which in turn adjusts the sampling point. Otherwise, the sampling point would drift causing sampling at the wrong part of the signal and resulting in receive errors.

In one embodiment, system 200 uses the delay measurements as input to perform a search that specifically determines settings for the runtime system to improve I/O. Based on the measured delay, and possibly other measured I/O parameters, search logic (which may be part of test logic, or may be separate logic) determines from measured values what settings to use for I/O between the devices. In one embodiment, the search logic can use the measurements to generate one or more representative performance curves for I/O. Based on the representative curves, the search logic can perform a search function to determine what settings to use to satisfy better performance for at least one parameter, while at least maintaining required (by standard or configuration) performance for the others. The search logic can include any of n-dimensional search logic, 1-dimensional search logic (to perform n 1-dimensional searches), linear fit search logic, quadratic fit search logic, steepest descent search logic, curve fitting search logic, or others. It will be understood that n represents an integer indicating the number of combinations to search. In one embodiment, the search logic can also combine multiple measurements together to either reduce repeatability noise or extrapolate to worst case conditions.

Figure 3:
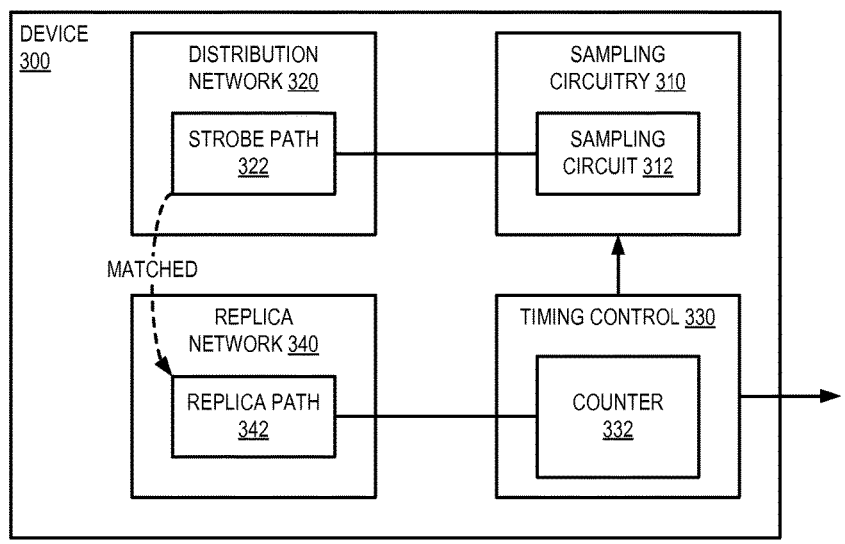
FIG. 3 is a block diagram of an embodiment of a system having replica network for a replica clock distribution path for an unmatched receiver circuit.

FIG. 3 is a block diagram of an embodiment of a system having replica network for a replica clock distribution path for an unmatched receiver circuit. Device 300 is one example of an embodiment of system 200 of FIG. 2. Device 300 includes sampling circuitry 310 to sample a received or incoming signal from a transmitting device (not shown). The sampling timing of sampling circuit 312 is controlled by strobe path 322, which is part of distribution network 320. As illustrated, sampling circuit 312 can be one of multiple sampling circuits of sampling circuitry 310 of device 300. Typically, the timing of one strobe path 322 would indicate the timing for all strobe paths of distribution network 320, and thus the timing for all sampling circuitry 310.

Replica path 342 is matched to strobe path 322. Similarly to how the timing of strobe path 322 is indicative of the timing of all distribution network 320, the timing of replica path 342 is indicative of strobe path 322, and thus of distribution network 320. Replica path 342 is illustrated as part of replica network 340. In one embodiment, replica network 340 is a circuit equivalent of distribution network 320, rather than an entire network. Thus, replica path 342 and replica network 340 could be considered the same in certain implementations.

In one embodiment, replica path 342 is or includes an oscillator circuit, which feeds back a signal to an amplifier at the front of the path. The number of oscillations in a given time period can provide a value that indicates the timing of replica path 342. By comparing the number of oscillations of one test with a previously stored value, device 300 can determine a magnitude and a sign of a change in delay through the path. In one embodiment, timing control 330 includes counter 332 to count the oscillations of an embodiment of replica path 342 that includes an oscillator or a ring oscillator. In one embodiment, timing control 330 (or a transmitter device to which timing control 330 sends the value of counter 332) includes or has access to a storage device (e.g., a register—not shown), to store an oscillator count to compare to a newer count.

In one embodiment, replica network 340 and distribution network 320 are integrated on the same integrated circuit as well as being circuit equivalents. Thus, the circuits would be matched in process, and would be expected to behave the same in operation. Replica network 340 can further be placed in close proximity on the same substrate as distribution network 320, which would further ensure that temperature changes and temperature hot spots will affect replica network 340 and distribution network 320 the same.

The delay adjustment on the transmitter and/or an adjustment to the timing of the strobe signal can be based on the count of counter 332. In one embodiment, timing control 330 performs the computations to determine a delay adjustment. In one embodiment, timing control 330 sends the count of counter 332 to the transmitter, which performs the computations. Whether at the memory device or at the controller or processor, the computations can be very consuming of processing resources. Instead of performing divisions in the computations, the computing processing resources can use Taylor expansions to obtain a working approximation. Such an approach is described in more detail below with respect to FIG. 4B. The use of Taylor expansions and/or the precalculation of certain values can reduce the runtime computational requirements, by reducing the need to perform runtime/real-time division operations and/or other hardware-based computations. Thus, the overall hardware computation load can be reduced. Precalculation can be performed for any value known prior to the measurement of the oscillator count. Such computations can be performed by firmware a priori to the oscillator count/timing measurements. The results of the precalculations can be stored in registers or other storage to be accessed to compute a delay adjustment.

Figure 4A:
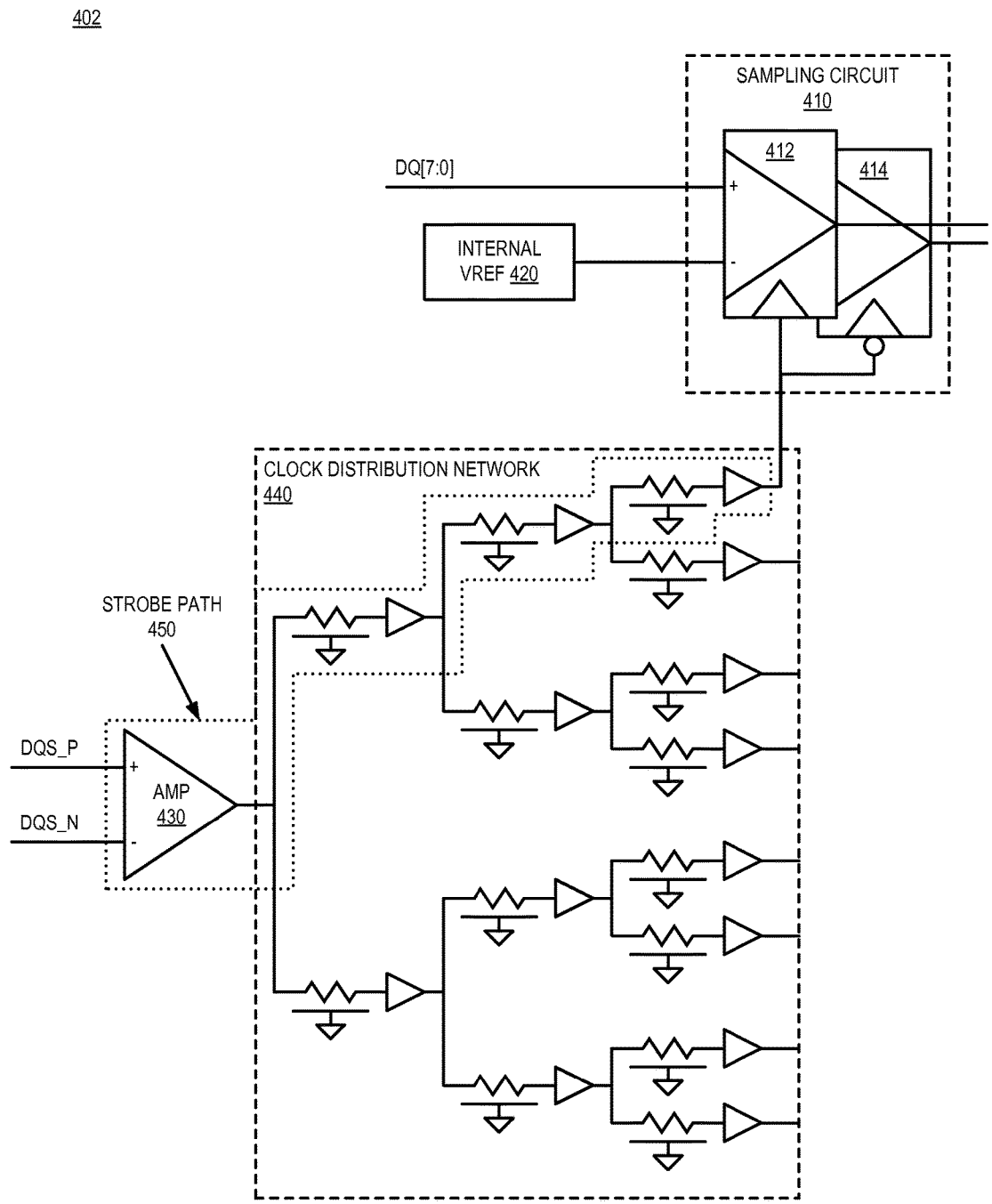
FIG. 4A is a block diagram of an embodiment of an unmatched receiver circuit.

FIG. 4A is a block diagram of an embodiment of an unmatched receiver circuit. Circuit 402 is an unmatched receiver circuit, including sampling circuit 410, unmatched amplifier 430, and clock distribution network 440. Sampling circuit 410 samples a received data signal DQ[7:0] against an internal reference voltage Vref 420. It will be understood that the data signal can be more of fewer than 8 bits, depending on the configuration of the system in which circuit 402 is a part. Sampling circuit 410 includes element 412 to provide a sample of the input signal, and element 414 to provide a complementary sample of the input signal for the case of double data rate systems where both edges of the clock are used to transmit data. Thus, the complementary path may not be needed in single data rate configurations. Other configurations are possible. Elements 412 and 414 are sampling amplifiers, which sample the actual received signal, and amplify the sample. Thus, the amplification can be performed by a lower speed amplifier as compared to amplifying prior to sampling, as with a matched configuration.

Amplifier 430 receives as inputs a pull-up strobe signal and a pull-down strobe signal. Clock distribution network 440 distributes the strobe or sample signal to multiple different elements, for example, multiple different sampling elements (not shown). The exact number of levels of distribution network 440 will vary by implementation. It will be understood that a binary tree distribution network is shown for simplicity. Commonly, and H-tree (where each additional level includes four branches instead of just two, and hence looks like an "H") is used. Whichever configuration of distribution network 440 is used, and however many levels are used, there is a strobe path or a delay path from amplifier 430 to sampling elements 412 and 414.

The delay through strobe path 450 changes over time based on operation of the device, through aging, changing voltage levels, changes in temperature, or possibly other operating conditions. It will be understood that the timing through strobe path 450 is not matched with the delay for the data signal (which could be expressed as tDQ≠tDQS). The timing difference can be compensated through changing the timing of the transmitted signal, or changing when the data strobe is generated. It will be understood that the transmission lines (traces or wires) along the different levels of clock distribution network are illustrated as having resistance and capacitance, as is commonly shown in the industry. Another common illustration includes a representation of an inductor on each transmission line, indicating that the delay of each line is created by a complex impedance due to the resistance, capacitance, and inductance inherent in the lines. It will also be understood that each triangle represents a buffer to prevent loss of the signal as it propagates through strobe path 450.

Figure 4B:
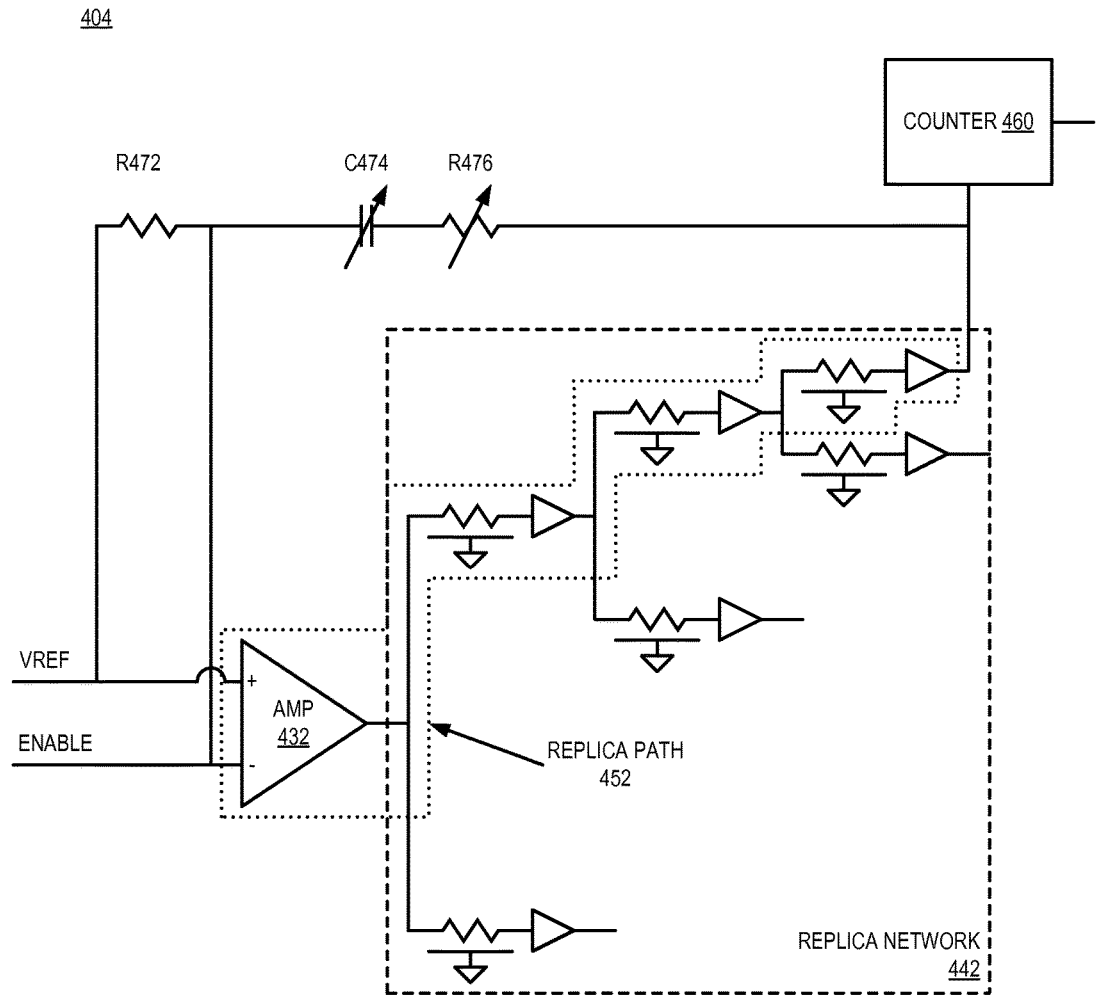
FIG. 4B is a block diagram of an embodiment of an oscillator circuit with a replica clock distribution path for the unmatched receiver circuit of FIG. 4A.

FIG. 4B is a block diagram of an embodiment of an oscillator circuit with a replica clock distribution path for the unmatched receiver circuit of FIG. 4A. Replica circuit 404 can be integrated onto the same substrate as circuit 402 using the same processing steps. In one embodiment, replica circuit 404 is placed in close physical proximity to circuit 402 on the substrate. Thus, the behaviors of the two circuits should track closely with respect to changes in delay due to environmental conditions. Replica circuit 404 is parallel to circuit 402, and operates independently of and in the background with respect to circuit 402. As a replica, replica network 442 has the same structure as distribution network 440. Thus, replica path 452 has the same delay as strobe path 450.

As shown, replica circuit 404 is configured as or includes a ring oscillator. The ring oscillator will generate oscillations for a period of N cycles (where N is a number of cycles for which the enable signal input to amplifier 432 is active). Thus, N is a number of cycles for which replica path 452 of replica circuit 450 is enabled. In one embodiment, replica circuit 404 is not considered to include counter 460, but instead provides input to counter 460. In another embodiment, counter 460 is considered part of replica circuit 404. Counter 460 keeps track of the number of oscillations per period of cycles for replica path 452. Thus, a system in which circuit 402 and 404 belong can compute the delay through the distribution network, and in particular, can identify variations in the delay. The delay can be computed as or based on 1 over count, where count is the final count value stored in counter 460 after N cycles. Counter 460 can be implemented with, for example, 8 to 16 bits in most cases for sufficient accuracy.

Replica path 452 can be referred to as a "dummy path" relative to the real data path or real strobe path of circuit 402. Replica circuit 404 can directly measure tDQS path delay with the ring oscillator configuration without impacting normal operation of the receiver. In one embodiment, replica circuit 404 operates continuously, or nearly continuously, generating a large number of samples to reduce noise while still achieving much higher bandwidth than known periodic training approaches. Mathematically, the ring oscillator frequency can be expressed as a function of system clock frequency, where the system clock frequency could be derived from a variety of potential sources. The expression can be: Equation1: $F_{RingOsc}=F_{SystemClk}*ROCount/N$, where $F_{RingOsc}$ is the frequency of the ring oscillator circuit, $F_{SystemClk}$ is the frequency of the system clock, ROCount is the final count of the ring oscillator (as recorded by counter 460), and N is a number of system clock cycles for which the ring oscillator is enabled or active.

By making N large, it is possible to get a very accurate measurement of the delay, and any noise in the system will automatically be averaged inside the ring oscillator with zero additional overhead. For example, allowing circuit 404 to run for 1 us, where a typical value of tDQS is 0.5 ns, would provide an ROCount of approximately 2000. Any clock jitter or supply noise will have been averaged over the 2000 oscillations, providing a measurement for tDQS that is accurate to within less than 1%.

To calculate the drift in tDQS delay over time, the system can store at least one value for ROCount from a previous measurement, and compare a new ROCount value against the stored value. In one embodiment, an initial value for ROCount can be generated during BIOS (basic input/output system) training when DQ is centered around DQS. Thus, one measurement of the actual system can be made, and a new delay value calculated based on the stored measurement, as opposed to the iterative nature of a periodic training approach. In one embodiment, the drift can be expressed mathematically as Equation2: $\Delta tDQS=N/F_{SystemClk}*(1/RO-$ Count$_{NEW}$−1/ROCount$_{OLD}$), where ΔtDQS is the change in strobe path delay, N is the number of system clock cycles for which the testing/measurement is enabled, F$_{SystemClk}$ is the frequency of the system clock, ROCount$_{NEW}$ is the value of the current measurement of ROCount, and ROCount$_{OLD}$ is the stored value of ROCount.

It will be understood that the mathematical expression for the drift calculation requires a division operation, which is a reasonably expensive operation to implement in digital hardware. Equation2 can be further estimated by Taylor expansions to: Equation3: ΔtDQS≈(N/F$_{SystemClk}$)−(N/(F$_{SystemClk}$/ROCount$_{OLD}$))*ROCount$_{NEW}$, and Equation4: ΔtDQS≈(N/(F$_{SystemClk}$/ROCount$_{OLD}^2$))* ROCount$_{NEW}^2$−(3*N/(F$_{SystemClk}$/ROCount$_{OLD}$))* ROCount$_{NEW}$+(2*N/F$_{SystemClk}$), where Equation3 is a first order Taylor expansion of Equation2, and Equation4 is a second order Taylor expansion of Equation2. Note that the number of cycles, N, to measure, the system clock frequency, F$_{SystemClk}$, and the stored ring oscillator count, ROCount$_{OLD}$, are all known values. Thus, each of the required division operations for equations 3 and 4 can be performed not in real time, stored, and accessed for use in multiplication in real time. Thus, Equation3 and Equation4 only require real time multiplication with precomputed division operations. It will be understood that higher order Taylor expansions, and/or other estimation techniques could also be used.

Circuit 404 achieves the inversion necessary for oscillation by connecting the feedback from the output of replica network 442 to the inverting terminal of amplifier 432, and Vref for the other terminal. Other implementations can also achieve the inversion in different ways, and other implementations could use a differential DQS feedback, instead of the single ended version shown in FIG. 4B. It will be understood that replica network 442 can be implemented as a circuit equivalent of distribution network 440. Thus, each leg of the network can be terminated at the buffer without affecting the delay along replica path 452. Thus, replica network 442 can have one or multiple full replica paths, where any one path is indicative of the delay for every one of the paths.

In one embodiment, circuit 404 AC couples the receiver. The AC coupling can allow the common mode voltage, voltage swing, and slope to be adjusted with minimal impact to the delay matching. Thus, the input swing, common mode voltage, and slope of circuit 404 can be adjusted to match the real DQS pad signal. In one embodiment, the coupling capacitor, C474 is adjustable or variable to allow tuning of the circuit. In one embodiment, the feedback path also includes resistor R476 to allow for adjustment in the receiver slope. Resistor R476 can also be adjustable or variable to allow tuning the circuit response. Thus, the feedback timing response can be tuned based on the behavior of the actual data path in circuit 402. The feedback response time can be modified based on environmental conditions, such as aging of the device. In one embodiment, such AC adjustment to the feedback could require additional startup circuitry (not shown) to define the initial starting condition for the feedback. The AC coupling may also require some time to stabilize the common mode, depending on initial conditions, which could extend the desired averaging or measurement period (e.g., larger N), or a warm up period in the ring oscillator prior to enabling the counting (e.g., enable for N+X cycles, where counter 460 is turned on after X cycles).

It will be understood that while amplifier 430 is not matched to the amplifiers of elements 412 and 414, amplifier 432 is matched to amplifier 430. Additionally, replica path 452 is matched to strobe path 450.

FIG. 5 is a timing diagram of an embodiment of operation timing for an oscillator circuit with a replica clock distribution path. FIG. 5 illustrates one embodiment of a flow of commands to a DRAM device. Clock signal 510 is the system clock. CMD 520 is the DRAM command signal. PRE ALL represents an initialization command. There is a delay of tRPab between when the PRE ALL command is issued and the issuance of the MRW Start command. MRW (mode register write) Start represents a command to start the oscillation. Ring oscillator signal RO 530 starts to oscillate after a delay of tRODelay from when MRW Start is issued.

Once RO 530 starts to oscillate, count 540 begins counting the oscillations. There is a period of oscillation as shown by the vertical break lines, after which the controller issues an MRW Stop command, which stops the oscillations. After a delay of tRODelay, the ring oscillator stops, and the counter settles to a count of X. After a delay of tWait, the controller issues an MRR (mode register read) Result command, which requests the results of the counter. After a period of RL+tDQSCK, the memory device returns the value X on DQ 550.

Thus, from the perspective of a DRAM protocol, the ring oscillator can be accessed through MRW/MRR commands, explicit signals, or communicated some other way. In one embodiment, the value of N (the number of clock 510 cycles to oscillate) can be implemented in either the memory controller, which would require a separate stop oscillator command, or in the DRAM using a counter. In one embodiment, the counter that counts oscillations is included in the memory controller. In such an implementation, the memory controller and memory device would need a signal to feed back the result, which would consume bandwidth between them. In one embodiment, the counter that counts the oscillations is included in the memory device, and a final count is all that is fed back to the memory controller. Such an implementation could require a separate MRR command to read back the oscillator count. It will be understood that the example in FIG. 5 is only one example in a memory context, and is not limiting. Other explicit and implicit communication methods are possible.

In one embodiment, the oscillation method can be used to get a rough estimate of one or more critical DRAM timing delays, such as tDQSCK, and how they change with DRAM voltage and/or temperature. It will be understood that such a usage would likely not be as accurate as a dedicated measurement; however, it can provide insight into certain timing delays and thus provide multiple pieces of information with a single technique.

Figure 6:
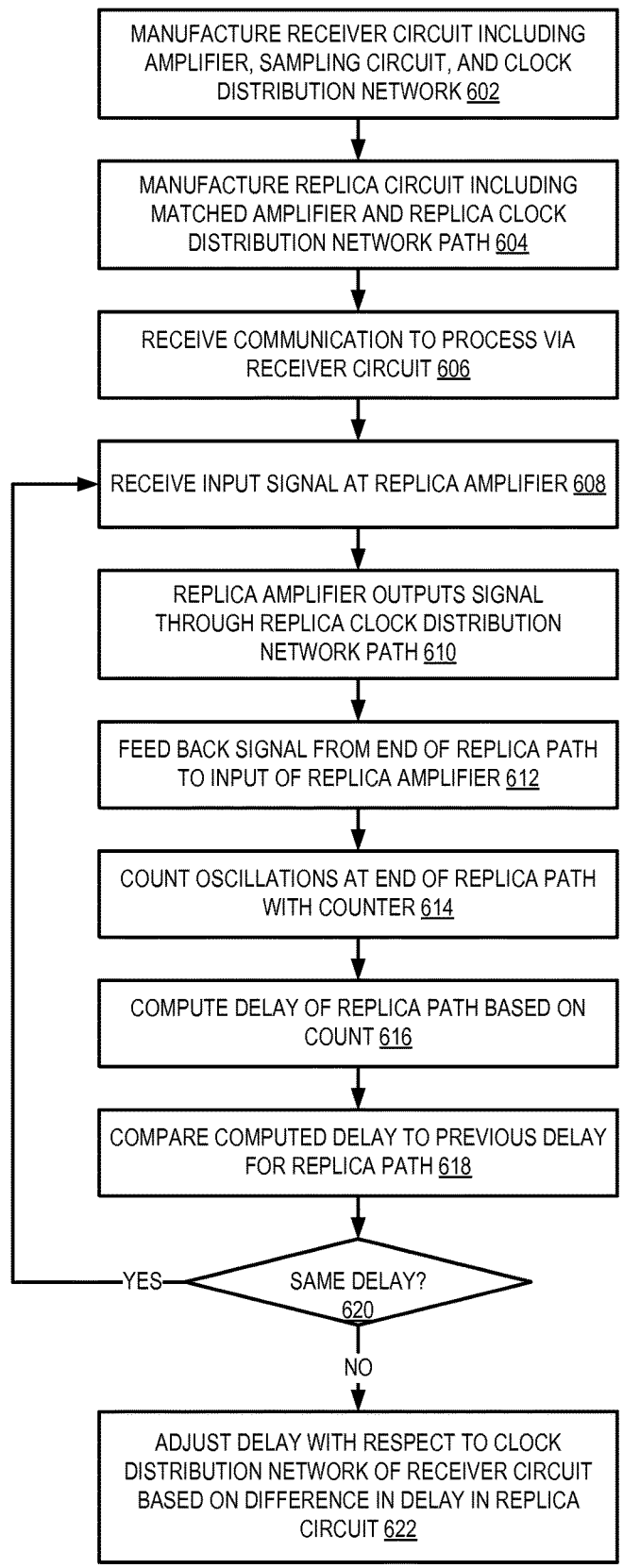
FIG. 6 is a flow diagram of an embodiment of a process for adjusting delay in a clock distribution network based on detected delay changes in a replica clock distribution network.

FIG. 6 is a flow diagram of an embodiment of a process for adjusting delay in a clock distribution network based on detected delay changes in a replica clock distribution network. In one embodiment, device manufacturer manufactures a receiver circuit for I/O in a component. The receiver circuit includes an amplifier, sampling circuit, and clock distribution network, 602. The sampling circuit and amplifier can be part of the same element. The manufacturer also manufactures a replica circuit on the component. The replica circuit includes a matched amplifier (matched with an amplifier of the clock distribution network of the receiver circuit), and a replica clock distribution network path, 604.

In operation, the receiver circuit receives a communication to process from a transmitting device, 606. The receiver circuit processes the input signal. The receiver circuit can process many such input signals. In parallel, and independently of the operation of the receiver circuit (e.g., the operation of the replica circuit does not directly affect the operation of the receiver circuit, and vice versa), the receiving device generates an enable signal. A replica amplifier of a replica circuit receives the input or enable signal, 608.

The replica amplifier outputs a signal through a replica clock distribution network path, 610. The replica path is matched to a clock distribution network path of the receiver circuit. In one embodiment, the replica path is simply a single path, rather than an entire replica clock distribution network. Thus, the replica path can be implemented as a circuit equivalent of the clock distribution network of the receiver circuit. The replica circuit feeds back the output of the replica path or feeds back from the end of the replica path to the input of the replica amplifier, 612. The feedback path causes the circuit to oscillate.

A counter at the end of the replica path counts the oscillations, 614. The counter can provide the count to a register or to a controller device. Based on the count, the system computes a delay of the replica path, and in particular determines if the delay has changed, 616. The computation can be performed by the receiving device or by the transmitting device. The device that does the computation can compare the current delay to the previous delay for the replica path, 618. In one embodiment, the computation involves comparing the current oscillator count to a previous oscillator count value.

If the delays are the same, 620 YES branch, there is nothing to adjust, and the receiver circuit continues to operate as it previously did. The oscillator circuit will restart at some future time when it is again enabled, 608. If the delays are different, 620 NO branch, the system adjusts delay of the I/O with respect to the clock distribution network of the receiver circuit based on the difference in delay in the replica circuit, 622. In general, the system can adjust the delay between a transmitter source clock and the unmatched receiver circuit based on the delay in the replica clock distribution network. In one embodiment, the adjustment includes an adjustment in operation of the transmitter. In one embodiment, the adjustment includes an adjustment to receive settings that control operation of the receiver. In one embodiment, the adjustment includes an adjustment in operation of the clock distribution network. The adjustments can be implemented through adjusting electrical I/O parameters of the various transmit and/or receive circuits. In one embodiment, search logic implements a search to determine which I/O operating parameters to adjust.

Figure 7:
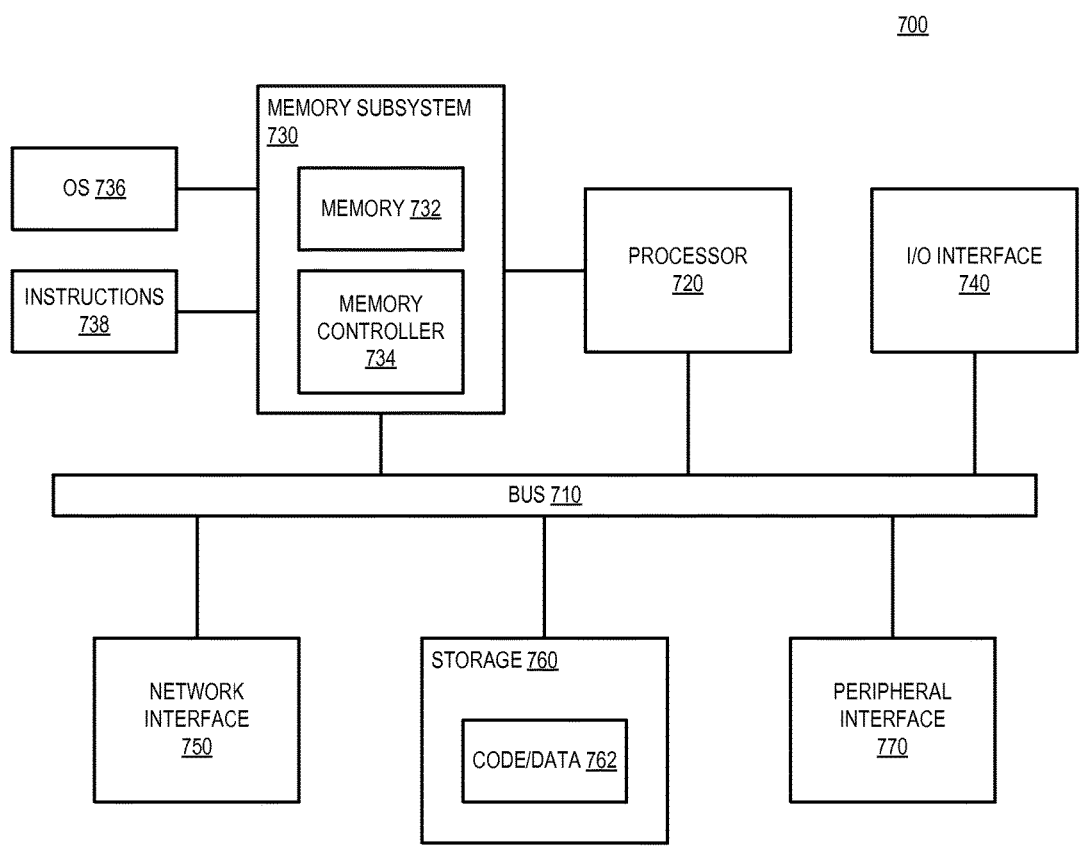
FIG. 7 is a block diagram of an embodiment of a computing system in which a replica clock distribution path can be implemented.

FIG. 7 is a block diagram of an embodiment of a computing system in which a replica clock distribution path can be implemented. System 700 represents a computing device in accordance with any embodiment described herein, and can be a laptop computer, a desktop computer, a server, a gaming or entertainment control system, a scanner, copier, printer, routing or switching device, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 includes memory device 732 where it stores data, instructions, programs, or other items. In one embodiment, memory subsystem includes memory controller 734, which is a memory controller in accordance with any embodiment described herein, and which includes a scheduler to generate and issue commands to memory device 732.

In one embodiment, memory subsystem 730 and memory device 732 implement feedback generated from a replica clock distribution path to improve the timing and accuracy of the communication from the memory controller to the memory device. In one embodiment, memory device 732 includes a replica distribution network matched to a strobe distribution network. The memory device determines magnitude and direction of delay shift by a ring oscillator in the replica network. The system uses a count of the oscillations to compute delay shift and adjust operation of one or more I/O parameters to account for the delay shift.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

Figure 8:
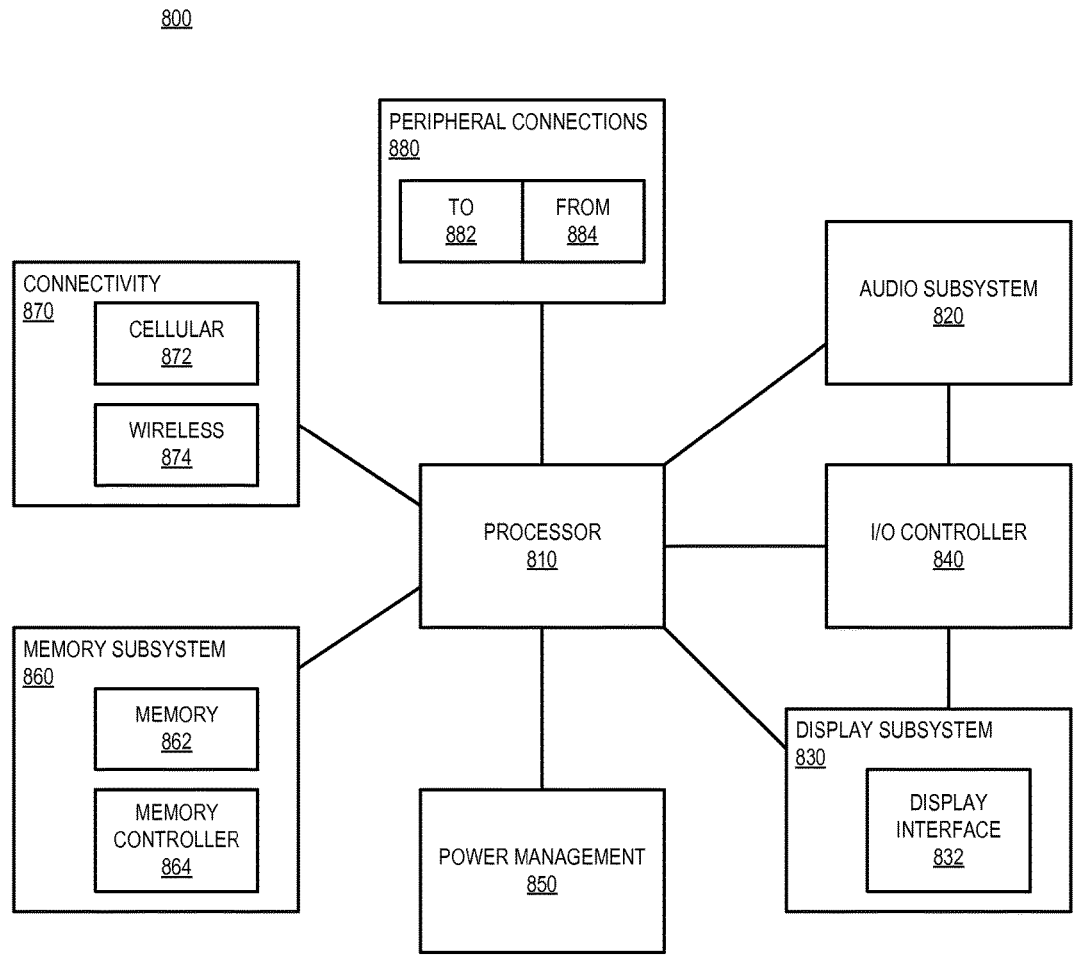
FIG. 8 is a block diagram of an embodiment of a mobile device in which a replica clock distribution path can be implemented.

FIG. 8 is a block diagram of an embodiment of a mobile device in which a replica clock distribution path can be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. In one embodiment, processor 810 includes optical interface components in addition to a processor die. Thus, the processor die and photonic components are in the same package. Such a processor package can interface optically with an optical connector in accordance with any embodiment described herein.

The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features). In one embodiment, device 800 includes power management 850 that manages battery power usage, charging of the battery, and features related to power saving operation.

Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to memory device 862.

Connectivity 870 includes hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, one or more components of system 800 implement feedback generated from a replica clock distribution path to improve the timing and accuracy of the communication between components. In one embodiment, a receiving component includes a replica distribution network matched to a strobe distribution network. The receiving device determines magnitude and direction of delay shift by a ring oscillator in the replica network. The system uses a count of the oscillations to compute delay shift and adjust operation of one or more I/O parameters to account for the delay shift.

In one aspect, an apparatus having an unmatched communication architecture includes an unmatched receiver circuit, including a data path including a first amplifier and a sampling circuit; and a clock distribution network coupled from a second amplifier to the sampling circuit to provide a strobe signal to the sampling circuit, where the second amplifier is not matched to the first amplifier; and a ring oscillator circuit, including a third amplifier matched to the second amplifier; a counter to count oscillations for a period of time; a replica clock distribution network coupled from the third amplifier to the counter, where the replica clock distribution network is a replica of the clock distribution network of the unmatched receiver circuit; and a feedback path from the clock distribution circuit to the third amplifier.

In one embodiment, the data path includes a sampling amplifier, which includes the first amplifier and the sampling circuit. In one embodiment, the clock distribution network comprises an H-tree clock distribution network. In one embodiment, the unmatched receiver circuit and the ring oscillator circuit are integrated on a single integrated circuit die. In one embodiment, the replica clock distribution network is a circuit equivalent of the clock distribution network of the unmatched receiver circuit. In one embodiment, the feedback path includes a tunable RC circuit to adjust a response time of the ring oscillator circuit.

In one embodiment, the apparatus further includes logic to compute a delay adjustment for the clock distribution network of the unmatched receiver circuit based on a number of oscillations counted by the counter in the ring oscillator circuit. In one embodiment, the apparatus further includes a memory device to store a value representing a pre-computed division of numbers, wherein the logic computes the delay adjustment with the value without performing real-time division. In one embodiment, the apparatus further includes logic to communicate the number of oscillations counted by the counter to a transmitting device to cause the transmitting device to adjust a timing of its output signal to the receiver circuit. In one embodiment, the apparatus further includes logic to communicate the number of oscillations counted by the counter to a receiver device to cause the receiver device to adjust a timing of its signal processing parameters to receive signals from a transmitter circuit.

In one aspect, an electronic device with a memory device that has an unmatched receiver circuit including a hardware platform including a processor; a memory device on the hardware platform to receive communication from a memory controller device on the hardware platform, the memory device including an unmatched receiver circuit, including a data path including a first amplifier and a sampling circuit; and a clock distribution network coupled from a second amplifier to the sampling circuit to provide a strobe signal to the sampling circuit, where the second amplifier is not matched to the first amplifier; and a ring oscillator circuit, including a third amplifier matched to the second amplifier; a counter to count oscillations for a period of time; and a replica clock distribution network coupled from the third amplifier to the counter, where the replica clock distribution network is a circuit equivalent of the clock distribution network of the unmatched receiver circuit; and a touchscreen display coupled to generate a display based on data accessed from the memory device.

In one embodiment, the data path includes a sampling amplifier, which includes the first amplifier and the sampling circuit. In one embodiment, the clock distribution network comprises an H-tree clock distribution network. In one embodiment, the unmatched receiver circuit and the ring oscillator circuit are integrated on a single integrated circuit die. In one embodiment, the replica clock distribution network is a circuit equivalent of the clock distribution network of the unmatched receiver circuit. In one embodiment, the feedback path includes a tunable RC circuit to adjust a response time of the ring oscillator circuit.

In one embodiment, the memory device further includes logic to compute a delay adjustment for the clock distribution network of the unmatched receiver circuit based on a number of oscillations counted by the counter in the ring oscillator circuit. In one embodiment, the memory device further includes a memory component to store a value representing a pre-computed division of numbers, wherein the logic computes the delay adjustment with the value without performing real-time division. In one embodiment, the memory device further includes logic to communicate the number of oscillations counted by the counter to a transmitting device to cause the transmitting device to adjust a timing of its output signal to the receiver circuit. In one embodiment, the memory device further includes logic to communicate the number of oscillations counted by the counter to a receiver device to cause the receiver device to adjust a timing of its signal processing parameters to receive signals from a transmitter circuit.

In one aspect, a method for communicating with an unmatched receiver circuit includes feeding back a signal from an output of a replica clock distribution network to an input of a replica amplifier to cause oscillation through the replica clock distribution network, where the replica clock distribution network is a replica of a clock distribution network of an unmatched receiver circuit, and the replica amplifier is a replica of a sampling amplifier of the unmatched receiver circuit, where an output of the replica amplifier is input to the clock distribution network; counting a number of oscillations through the replica clock distribution network with a counter for a period of time; computing a change in a delay through the replica clock distribution network; and adjusting a delay between a transmitter source clock and the unmatched receiver circuit based on the delay through the replica clock distribution network.

In one embodiment, feeding back the signal from the output of the replica clock distribution network comprises feeding back the signal from a clock distribution network that replicates a data path which includes a first amplifier and a sampling circuit. In one embodiment, feeding back the signal from the output of the replica clock distribution network comprises feeding back the signal from a clock distribution network that replicates an H-tree clock distribution network. In one embodiment, counting the number of oscillations is performed with a ring oscillator circuit integrated on a single integrated circuit die with the unmatched receiver circuit. In one embodiment, feeding back the signal through the replica clock distribution network comprises feeding back the signal through a circuit equivalent of the clock distribution network of the unmatched receiver circuit.

In one embodiment, the method further comprising tuning an RC circuit in a path that feeds back from the output of the replica clock distribution network to the input of the replica amplifier to adjust a response of the feedback based on changing environmental conditions of the unmatched receiver circuit. In one embodiment, the method further comprising computing a delay adjustment for the clock distribution network of the unmatched receiver circuit based on a number of oscillations counted by the counter. In one embodiment, the method further comprising storing a value representing a pre-computed division of numbers; and computing the delay adjustment with the value without performing real-time division. In one embodiment, the method further comprising communicating the number of oscillations counted by the counter to a transmitting device to cause the transmitting device to adjust a timing of its output signal to the receiver circuit. In one embodiment, the method further comprising communicating the number of oscillations counted by the counter to a receiver device to cause the receiver device to adjust a timing of its signal processing parameters to receive signals from a transmitter circuit.

In one aspect, an apparatus for communicating with an unmatched receiver circuit includes means for feeding back a signal from an output of a replica clock distribution network to an input of a replica amplifier to cause oscillation through the replica clock distribution network, where the replica clock distribution network is a replica of a clock distribution network of an unmatched receiver circuit, and the replica amplifier is a replica of a sampling amplifier of the unmatched receiver circuit, where an output of the replica amplifier is input to the clock distribution network; means for counting a number of oscillations through the replica clock distribution network with a counter for a period of time; means for computing a change in a delay through the replica clock distribution network; and means for adjusting a delay between a transmitter source clock and the unmatched receiver circuit based on the delay through the replica clock distribution network.

In one embodiment, the means for feeding back the signal from the output of the replica clock distribution network comprises means for feeding back the signal from a clock distribution network that replicates a data path which includes a first amplifier and a sampling circuit. In one embodiment, the means for feeding back the signal from the output of the replica clock distribution network comprises means for feeding back the signal from a clock distribution network that replicates an H-tree clock distribution network.

In one embodiment, the means for counting the number of oscillations includes means integrated on a single integrated circuit die with the unmatched receiver circuit. In one embodiment, the means for feeding back the signal through the replica clock distribution network comprises means for feeding back the signal through a circuit equivalent of the clock distribution network of the unmatched receiver circuit.

In one embodiment, the apparatus further comprising means for tuning an RC circuit in a path that feeds back from the output of the replica clock distribution network to the input of the replica amplifier to adjust a response of the feedback based on changing environmental conditions of the unmatched receiver circuit. In one embodiment, the apparatus further comprising means for computing a delay adjustment for the clock distribution network of the unmatched receiver circuit based on a number of oscillations counted by the counter. In one embodiment, the apparatus further comprising means for storing a value representing a pre-computed division of numbers; and means for computing the delay adjustment with the value without performing real-time division. In one embodiment, the apparatus further comprising means for communicating the number of oscillations counted by the counter to a transmitting device to cause the transmitting device to adjust a timing of its output signal to the receiver circuit. In one embodiment, the apparatus further comprising means for communicating the number of oscillations counted by the counter to a receiver device to cause the receiver device to adjust a timing of its signal processing parameters to receive signals from a transmitter circuit.

In one aspect, a computer readable storage medium having content stored thereon, which when executed by a computing device performs operation including feeding back a signal from an output of a replica clock distribution network to an input of a replica amplifier to cause oscillation through the replica clock distribution network, where the replica clock distribution network is a replica of a clock distribution network of an unmatched receiver circuit, and the replica amplifier is a replica of a sampling amplifier of the unmatched receiver circuit, where an output of the replica amplifier is input to the clock distribution network; counting a number of oscillations through the replica clock distribution network with a counter for a period of time; computing a change in a delay through the replica clock distribution network; and adjusting a delay between a transmitter source clock and the unmatched receiver circuit based on the delay through the replica clock distribution network.

In one embodiment, the content for feeding back the signal from the output of the replica clock distribution network comprises content for feeding back the signal from a clock distribution network that replicates a data path which includes a first amplifier and a sampling circuit. In one embodiment, the content for feeding back the signal from the output of the replica clock distribution network comprises content for feeding back the signal from a clock distribution network that replicates an H-tree clock distribution network. In one embodiment, the content for counting the number of oscillations includes means integrated on a single integrated circuit die with the unmatched receiver circuit. In one embodiment, the content for feeding back the signal through the replica clock distribution network comprises content for feeding back the signal through a circuit equivalent of the clock distribution network of the unmatched receiver circuit.

In one embodiment, the article of manufacture further comprising content for tuning an RC circuit in a path that feeds back from the output of the replica clock distribution network to the input of the replica amplifier to adjust a response of the feedback based on changing environmental conditions of the unmatched receiver circuit. In one embodiment, the article of manufacture further comprising content for computing a delay adjustment for the clock distribution network of the unmatched receiver circuit based on a number of oscillations counted by the counter. In one embodiment, the article of manufacture further comprising content for storing a value representing a pre-computed division of numbers; and computing the delay adjustment with the value without performing real-time division. In one embodiment, the article of manufacture further comprising content for communicating the number of oscillations counted by the counter to a transmitting device to cause the transmitting device to adjust a timing of its output signal to the receiver circuit. In one embodiment, the article of manufacture further comprising content for communicating the number of oscillations counted by the counter to a receiver device to cause the receiver device to adjust a timing of its signal processing parameters to receive signals from a transmitter circuit Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   an unmatched receiver circuit, including
      a data path including a first amplifier and a sampling circuit; and
      a clock distribution network coupled from a second amplifier to the sampling circuit to provide a strobe signal to the sampling circuit, where the second amplifier is not matched to the first amplifier; and
   a ring oscillator circuit, including
      a third amplifier matched to the second amplifier;
      a counter to count oscillations for a period of time;
      a replica clock distribution network coupled from the third amplifier to the counter, where the replica clock distribution network is a replica of the clock distribution network of the unmatched receiver circuit, the replica clock distribution network comprising at least one node that branches, the at least one node that branches coupled to a terminable leg; and
      a feedback path from the clock distribution circuit to the third amplifier.

2. The apparatus of claim 1, wherein the data path includes a sampling amplifier, the sampling amplifier comprising the first amplifier and the sampling circuit.

3. The apparatus of claim 1, wherein the clock distribution network comprises an H-tree clock distribution network.

4. The apparatus of claim 1, wherein the unmatched receiver circuit and the ring oscillator circuit are integrated on a single integrated circuit die.

5. The apparatus of claim 1, wherein the replica clock distribution network is a circuit equivalent of the clock distribution network of the unmatched receiver circuit.

6. The apparatus of claim 1, wherein the feedback path includes a tunable RC circuit to adjust a response time of the ring oscillator circuit.

7. The apparatus of claim 1, further comprising:
   logic to compute a delay adjustment for the clock distribution network of the unmatched receiver circuit based on a number of oscillations counted by the counter in the ring oscillator circuit.

8. The apparatus of claim 7, further comprising:
   a memory device to store a value representing a pre-computed division of numbers, wherein the logic is to compute the delay adjustment with the value without performing real-time division.

9. The apparatus of claim 1, further comprising:
   logic to communicate the number of oscillations counted by the counter to a transmitting device to cause the transmitting device to adjust a timing of its output signal to the receiver circuit.

10. The apparatus of claim 1, further comprising:
    logic to communicate the number of oscillations counted by the counter to a receiver device to cause the receiver device to adjust a timing of its signal processing parameters to receive signals from a transmitter circuit.

11. An electronic device comprising:
    a hardware platform including a processor;
    a memory device on the hardware platform to receive communication from a memory controller device on the hardware platform, the memory device including an unmatched receiver circuit, including
- a data path including a first amplifier and a sampling circuit; and
- a clock distribution network coupled from a second amplifier to the sampling circuit to provide a strobe signal to the sampling circuit, where the second amplifier is not matched to the first amplifier; and a ring oscillator circuit, including
- a third amplifier matched to the second amplifier;
- a counter to count oscillations for a period of time; and
- a replica clock distribution network coupled from the third amplifier to the counter, where the replica clock distribution network is a circuit equivalent of the clock distribution network of the unmatched receiver circuit, the replica clock distribution network comprising at least one node that branches, the at least one node that branches coupled to a terminable leg; and a touchscreen display coupled to generate a display based on data accessed from the memory device.

12. The electronic device of claim 11, wherein the data path includes a sampling amplifier, the sampling amplifier comprising the first amplifier and the sampling circuit.

13. The electronic device of claim 11, wherein the clock distribution network comprises an H-tree clock distribution network.

14. The electronic device of claim 11, wherein the unmatched receiver circuit and the ring oscillator circuit are integrated on a single integrated circuit die.

15. The electronic device of claim 11, wherein the replica clock distribution network is a circuit equivalent of the clock distribution network of the unmatched receiver circuit.

16. The electronic device of claim 11, wherein the feedback path comprises a tunable RC circuit to adjust a response time of the ring oscillator circuit.

17. The electronic device of claim 11, the memory device further comprising:
logic to compute a delay adjustment for the clock distribution network of the unmatched receiver circuit based on a number of oscillations counted by the counter in the ring oscillator circuit.

18. A method comprising:
feeding back a signal from an output of a replica clock distribution network to an input of a replica amplifier to cause oscillation through the replica clock distribution network, where the replica clock distribution network is a replica of a clock distribution network of an unmatched receiver circuit and comprises at least one branching node and at least one terminable leg, and the replica amplifier is a replica of a sampling amplifier of the unmatched receiver circuit, where an output of the replica amplifier is input to the clock distribution network;

counting a number of oscillations through the replica clock distribution network with a counter for a period of time;

computing a change in a delay through the replica clock distribution network; and adjusting a delay between a transmitter source clock and the unmatched receiver circuit based on the delay through the replica clock distribution network.

19. The method of claim 18, feeding back the signal through the replica clock distribution network comprises feeding back the signal through a circuit equivalent of the clock distribution network of the unmatched receiver circuit.

20. The method of claim 18, further comprising tuning an RC circuit in a path that feeds back from the output of the replica clock distribution network to the input of the replica amplifier to adjust a response of the feedback based on changing environmental conditions of the unmatched receiver circuit.

* * * * *